United States Patent
Hasebe et al.

(10) Patent No.: US 7,604,010 B2
(45) Date of Patent: Oct. 20, 2009

(54) FILM FORMATION APPARATUS AND METHOD OF USING THE SAME

(75) Inventors: Kazuhide Hasebe, Minami-Alps (JP); Nobutake Nodera, Kai (JP); Atsushi Endo, Kai (JP); Makoto Umeki, Kai (JP); Katsumi Nishimura, Kyoto (JP); Masakazu Minami, Kyoto (JP); Makoto Yoshida, Omihachiman (JP)

(73) Assignees: Tokyo Electron Limited, Tokyo (JP); HORIBA Ltd., Kyoto (JP)

( * ) Notice: Subject to any disclaimer, the term of this patent is extended or adjusted under 35 U.S.C. 154(b) by 421 days.

(21) Appl. No.: 11/209,741

(22) Filed: Aug. 24, 2005

(65) Prior Publication Data

US 2006/0042544 A1     Mar. 2, 2006

(30) Foreign Application Priority Data

Aug. 25, 2004   (JP)   ............... 2004-245749

(51) Int. Cl.
*H01L 21/00*   (2006.01)
(52) U.S. Cl. .............. 134/1.1; 156/345.24; 156/345.25; 216/59; 216/60; 216/67
(58) Field of Classification Search ............ 156/345.25, 156/345.24; 134/1.1; 216/59, 60, 67
See application file for complete search history.

(56) References Cited

U.S. PATENT DOCUMENTS

| | | | |
|---|---|---|---|
| 5,812,403 A * | 9/1998 | Fong et al. ................. 700/121 |
| 5,879,574 A * | 3/1999 | Sivaramakrishnan et al. .. 216/60 |
| 6,207,008 B1 * | 3/2001 | Kijima ................... 156/345.13 |
| 6,366,346 B1 * | 4/2002 | Nowak et al. .................. 356/72 |
| 6,620,108 B2 * | 9/2003 | Duval et al. ................. 600/532 |
| 2003/0136425 A1 * | 7/2003 | Murugesh et al. ............. 134/18 |

FOREIGN PATENT DOCUMENTS

| | | |
|---|---|---|
| JP | 3-293726 | 12/1991 |
| JP | 7-188932 | 7/1995 |
| JP | 9-53180 | 2/1997 |
| JP | 10-256244 | 9/1998 |
| JP | 2002-35706 | 2/2002 |
| JP | 2004-343026 | 12/2004 |
| KR | 2003-0065461 | 8/2003 |

* cited by examiner

*Primary Examiner*—Ram N. Kackar
(74) *Attorney, Agent, or Firm*—Oblon, Spivak, McClelland, Maier & Neustadt, L.L.P.

(57) ABSTRACT

A film formation apparatus for a semiconductor process includes a cleaning gas supply circuit, a concentration measuring section, and an information processor. The cleaning gas supply circuit is configured to supply a cleaning gas into a reaction chamber to perform cleaning of removing from an inner surface of the reaction chamber a by-product film derived from a film formation gas. The concentration measuring section is disposed in an exhaust system to monitor concentration of a predetermined component contained in exhaust gas from the reaction chamber. The information processor is configured to compare a measurement value obtained by the concentration measuring section with a preset value and to thereby determine an end point of the cleaning.

12 Claims, 4 Drawing Sheets

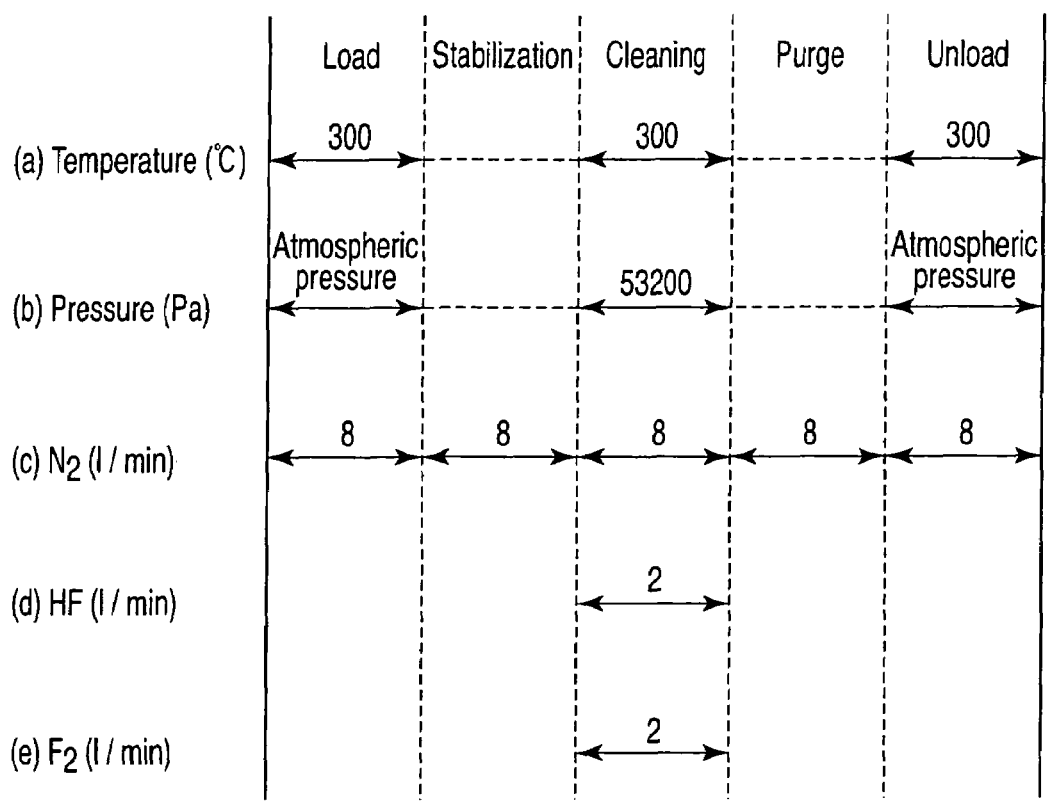
F I G. 4
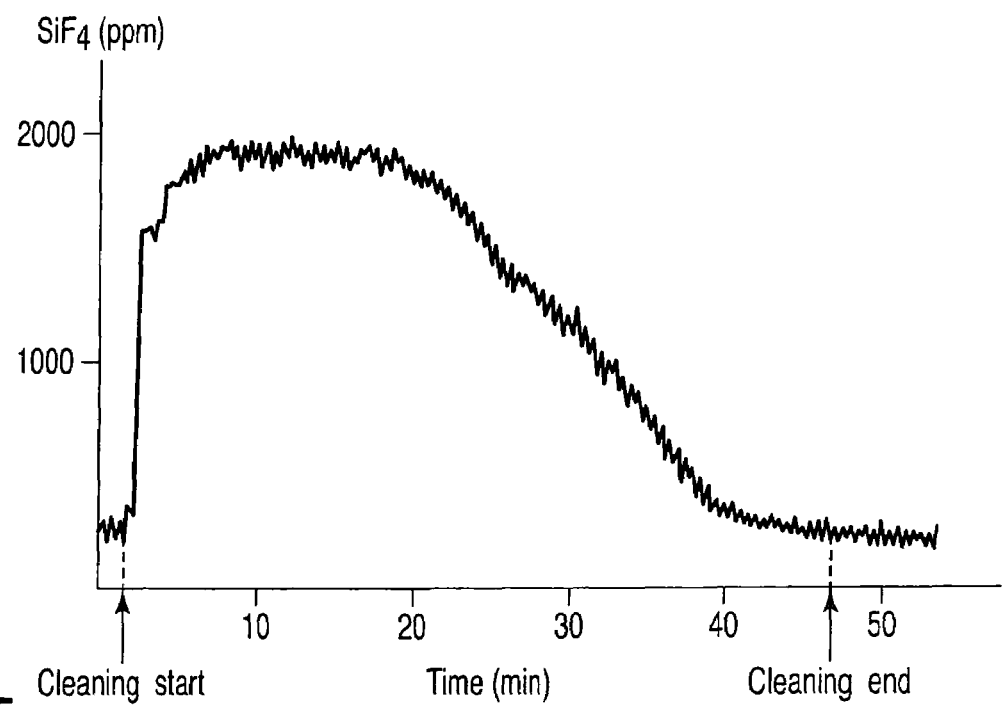
F I G. 5

FILM FORMATION APPARATUS AND METHOD OF USING THE SAME

CROSS-REFERENCE TO RELATED APPLICATIONS

This application is based upon and claims the benefit of priority from prior Japanese Patent Application No. 2004-245749, filed Aug. 25, 2004, the entire contents of which are incorporated herein by reference.

BACKGROUND OF THE INVENTION

1. Field of the Invention

The present invention relates to a film formation apparatus for a semiconductor process for forming a film on a target substrate, such as a semiconductor wafer, and also to a method of using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and thereby form a thin film thereon.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the interior of the reaction tube, some of the by-product films separate therefrom and generate particles. The particles may drop on the semiconductor wafer, which reduces the yield of semiconductor devices being fabricated.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are dry-etched and removed by the cleaning gas. Jpn. Pat. Appln. KOKAI Publication No. 3-293726 discloses a cleaning method of this kind. However, as described later, the present inventors have found that conventional cleaning methods of this kind have some difficulty in performing cleaning for an optimum cleaning time period (which varies depending on the conditions inside a reaction tube).

BRIEF SUMMARY OF THE INVENTION

An object of the present invention is to provide a film formation apparatus for a semiconductor process and a method of using the same, which allow cleaning to be performed for an optimum cleaning time period.

According to a first aspect of the present invention, there is provided a film formation apparatus for a semiconductor process, comprising:

a reaction chamber configured to accommodate a target substrate;

a heater configured to heat an interior of the reaction chamber;

an exhaust system configured to exhaust the interior of the reaction chamber;

a film formation gas supply circuit configured to supply a film formation gas into the reaction chamber to perform film formation of forming a film on the target substrate;

a cleaning gas supply circuit configured to supply a cleaning gas into the reaction chamber to perform cleaning of removing from an inner surface of the reaction chamber a by-product film derived from the film formation gas;

a concentration measuring section disposed in the exhaust system to monitor concentration of a predetermined component contained in exhaust gas from the reaction chamber; and an information processor configured to compare a measurement value obtained by the concentration measuring section with a preset value and to thereby determine an end point of the cleaning.

According to a second aspect of the present invention, there is provided a method of using a film formation apparatus for a semiconductor process, the method comprising:

performing cleaning of removing a by-product film deposited on an inner surface of a reaction chamber of the film formation apparatus, while supplying a cleaning gas into the reaction chamber, and setting the interior of the reaction chamber at a temperature and a pressure to cause the cleaning gas to react with the by-product film;

monitoring concentration of a predetermined component contained in exhaust gas from the reaction chamber in a predetermined period of the cleaning;

comparing a measurement value of the concentration of the predetermined component with a preset value, and thereby determining an end point of the cleaning; and finishing the cleaning based on the end point.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a view showing the recipe of a cleaning process according to an embodiment of the present invention;

FIG. 5 is a graph showing change with time in the concentration of silicon tetrafluoride contained in cleaning exhaust gas;

DETAILED DESCRIPTION OF THE INVENTION

Figure 1:
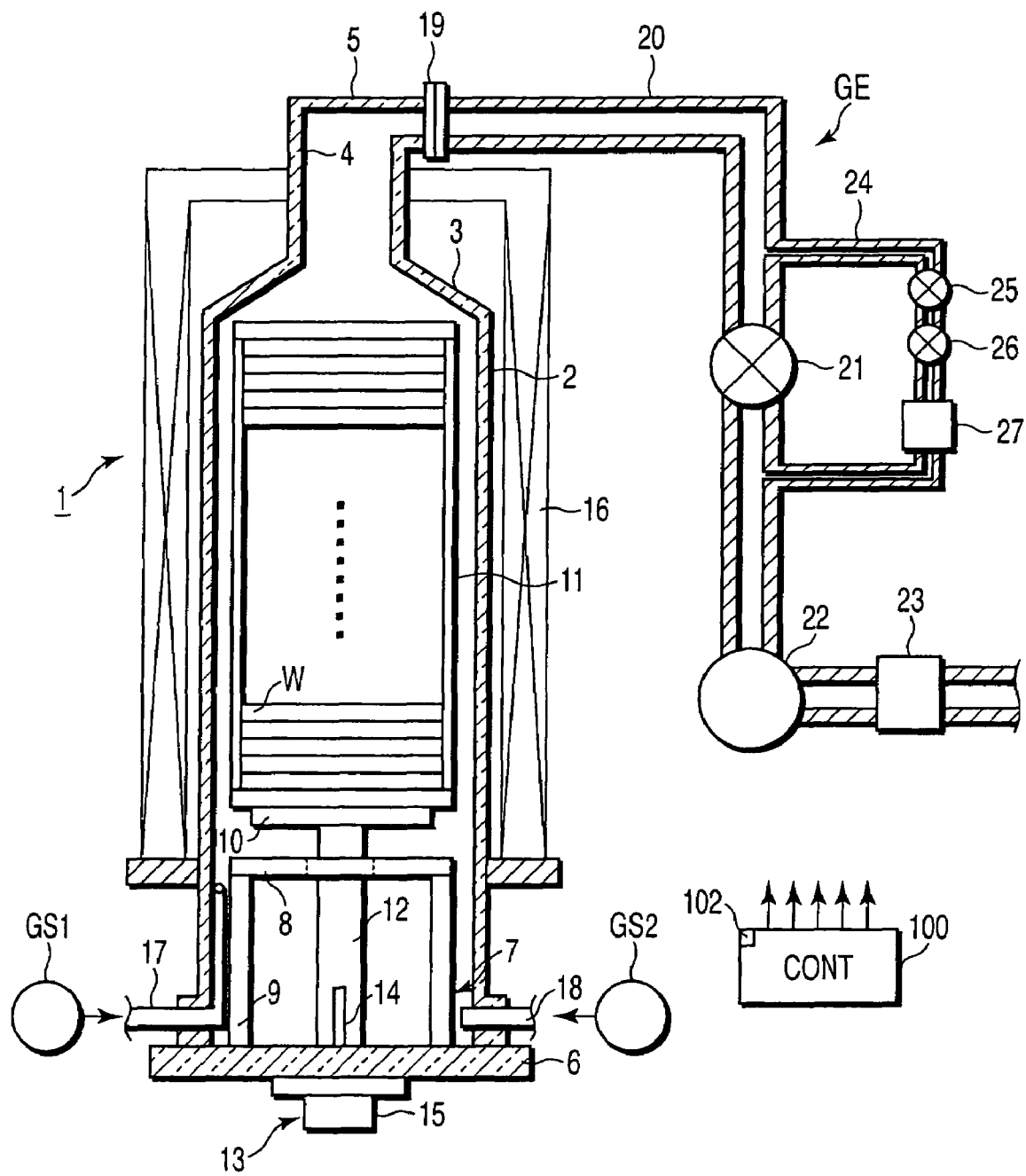
FIG. 1 is a view showing a vertical heat-processing apparatus according to an embodiment of the present invention.

In the process of developing the present invention, the inventors studied problems with regard to conventional methods for cleaning the interior of a reaction tube used in a film formation apparatus for a semiconductor process. As a result, the inventors have arrived at the findings given below.

Specifically, in cleaning of this kind, if the cleaning time period is too long, the materials of the reaction tube and so forth, such as quartz, are damaged (e.g., cracks are formed), and thus the service life of the reaction tube is shortened. Further, where cracks are formed on the inner surface of the reaction tube, powder of the wall material may fall off and generate particles. In addition, if the cleaning time period is too long, consumption of the cleaning gas is wastefully increased. On the other hand, if the cleaning time period is too short, by-product films deposited inside the reaction tube cannot be completely removed.

Accordingly, in cleaning of this kind, it is necessary to suitably manage the cleaning time period. For example, as a method of managing the cleaning time period, there is a method of utilizing the cleaning rate and a method of monitoring temperature.

The former method includes a step of calculating the cleaning time period on the basis of the cleaning rate of by-product films. The cleaning of the reaction tube is performed for the cleaning time period thus calculated. In this case, however, since the thickness of by-product films deposited inside the reaction tube is not constant, it is difficult to accurately manage the cleaning time period. Further, this method requires knowledge of the cleaning rate for each of different type films in advance.

The latter method utilizes reaction heat generated in cleaning (heat generated by reaction of the cleaning gas with by-product films deposited inside the reaction tube). For example, the temperature inside the reaction tube is monitored by a temperature sensor. On the basis of the temperature thus monitored, it is determined whether the reaction of the cleaning gas with the by-product films has finished. In this case, however, the reaction progress between the by-product films and cleaning gas can be known only at a place where the temperature sensor is disposed. Further, since the quartz material of the reaction tube also reacts with the cleaning gas and generates some reaction heat, it is difficult to reliably monitor solely the reaction heat between the by-product films and cleaning gas.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust system GE through an airtight exhaust line 5. As described later, the exhaust system GE has a pressure adjusting mechanism including, e.g., a valve and a vacuum exhaust pump. The exhaust system GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator (not shown). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas and a cleaning gas) into the reaction tube 2. Each process gas feed line 17 is connected to a process gas supply source GS1 through a mass-flow controller (MFC) (not shown).

A mixture gas of hexachloro disilane ($Si_2Cl_6$) and ammonia ($NH_3$), for example, is used as a film formation gas to form a silicon nitride film on the semiconductor wafers W. A mixture gas of fluorine ($F_2$), hydrogen fluoride (HF), and nitrogen ($N_2$) used as an inactive gas for dilution, for example, is used as a cleaning gas to remove by-product films (reaction products) deposited inside the reaction tube 2.

Although FIG. 1 shows only one process gas feed line 17, a plurality of process gas feed lines 17 are disposed in accordance with the type of gases to be supplied into the reaction tube 2, in this embodiment. Specifically, a film formation gas feed line for supplying the film formation gas into the reaction tube 2, and a cleaning gas feed line for supplying the cleaning gas into the reaction tube 2 penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through an MFC (not shown). As a purge gas, an inactive gas, such as nitrogen gas, is used.

The exhaust system GE includes an exhaust piping line 20 airtightly connected to the exhaust line 5 by a joint portion 19. The exhaust piping line 20 is provided with a main valve 21, a pump 22, and a trap from the upstream side. The main valve 21 is configured to adjust the opening degree of the exhaust piping line 20 to control the pressure inside the reaction tube 2 and exhaust piping line 20 at a predetermined value. The pump 22 is configured to exhaust gas inside the reaction tube 2 through the exhaust piping line 20 and exhaust line 5, and to adjust the pressure inside the reaction tube 2 and exhaust piping line 20. The trap 23 is formed of, e.g., a disk trap or water trap, and configured to adsorb particles in the exhaust gas, such as reaction products contained in the exhaust gas. The exhaust piping line 20 is provided with a dedicated heater (not shown), by which the temperature of the exhaust piping line 20 is adjusted to a predetermined value.

A bypass line 24 is connected to the exhaust piping line 20. One end of the bypass line 24 is connected to the exhaust piping line 20 upstream from the main valve 21, and the other end is connected to the exhaust piping line 20 downstream from the main valve 21, so as to bypass the main valve 21. The bypass line 24 has a small diameter, so that the flow rate of exhaust gas flowing therethrough (sectional area of the exhaust gas flow) becomes smaller than that through the exhaust piping line 20. The bypass line 24 is provided with a sub valve 25, a needle valve 26, and an infrared sensor 27 from the upstream side.

The sub valve 25 is configured to adjust the opening degree of the bypass line 24, so as to control the pressure inside the bypass line at a predetermined value. When the sub valve 25 is opened, the gas flowing through the exhaust piping line 20 is partly branched into the bypass line 24. The needle valve 26 has an opening degree adjusted in advance to set the pressure difference between the opposite ends of the needle valve 26 at a predetermined value.

Figure 2:
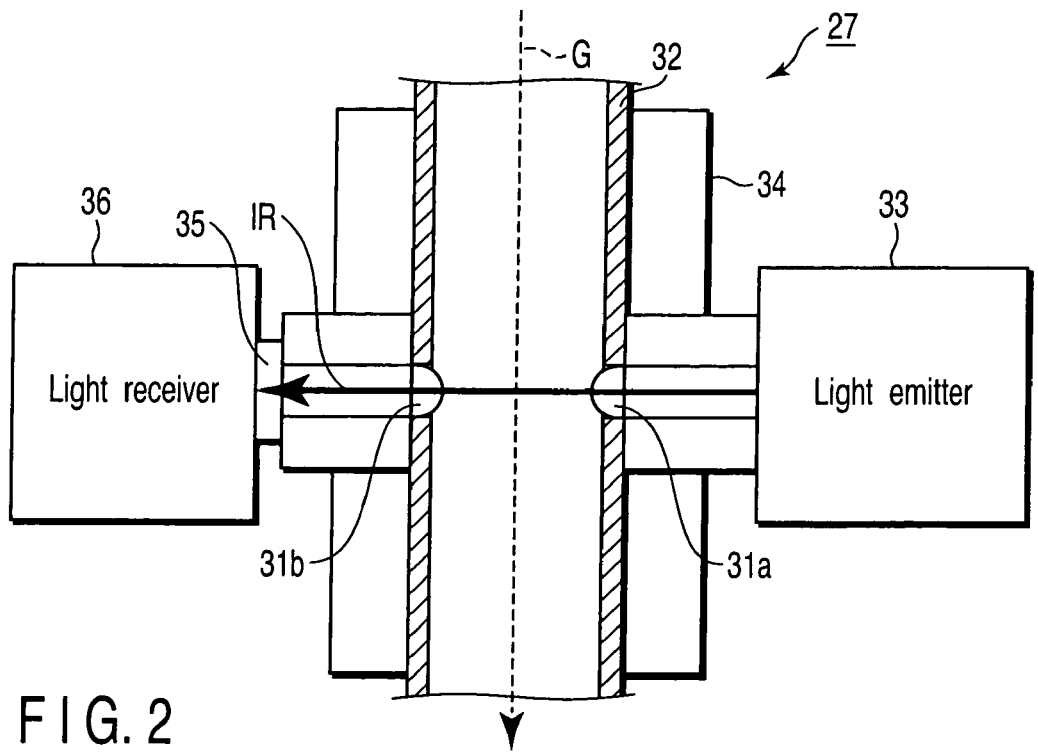
FIG. 2 is a view showing an infrared sensor used in the apparatus shown in FIG. 1.

The infrared sensor 27 utilizes the principle that the wavelength of infrared rays absorbed by a gas differs depending on the type of the gas, to measure the concentration of a predetermined component contained in the exhaust gas. FIG. 2 is a view showing the infrared sensor 27. The infrared sensor 27 has a cell 32 formed by a wall that constitutes part of the bypass line 24, i.e., that defines a passage of the exhaust gas. The cell 32 is supplied with gas G, which is part of the exhaust gas from the reaction tube 2, as a measurement sample through the bypass line 24. A pair of windows 31a and 31b are formed on the opposite sides of the cell 32 to face each other. An infrared light emitter 33 and a light receiver 36 are disposed outside the windows 31a and 31b, respectively. An optical filter 35 is disposed between the window 31b and light receiver 36. Further, the entirety of the cell 32 is covered with a heater 34 for the infrared sensor 27.

The windows 31a and 31b are preferably made of a material that transmits infrared rays and is high in heat resistance and corrosion resistance, such as barium difluoride ($BaF_2$). The heater 34 heats the cell 32 and windows 31a and 31b to a predetermined temperature, such as 150° C. or more. As a consequence, by-product powder exhausted from the reaction tube 2 is prevented from being deposited on the cell 32 and windows 31a and 31b.

The light emitter 33 radiates an infrared light beam IR onto the gas G in the cell 32 at a position corresponding to the windows 31a and 31b. Of the infrared light beam IR having passed through the gas G, the optical filter 35 allows only a predetermined wavelength band to pass therethrough, where the predetermined wavelength band corresponds to a band absorbed by a predetermined component selected as a measurement object. For example, the light receiver 36 has a function as a pyroelectric infrared detector, and is disposed to receive the infrared light beam IR having passed through the optical filter 35. This pyroelectric infrared detector calculates the concentration of the predetermined component contained in the gas G, on the basis of a decreasing ratio of the amplitude of a signal obtained when the gas G is present, relative to the amplitude of a signal obtained when the gas G is not present.

As described above, according to this infrared sensor 27, a predetermined wavelength band of the infrared light beam IR from the light emitter 33 is partly absorbed by a predetermined component selected as a measurement object contained in the gas G. Then, only this predetermined wavelength band of the infrared light beam IR is transmitted through the optical filter 35 and incident on the light receiver 36. Accordingly, the pyroelectric infrared detector forming the light receiver 36 is required only to measure the concentration of the measurement object component, and thus can have a simple structure.

The heat-processing apparatus 1 further includes a control section 100 with an information processor 102 for controlling respective portions of the apparatus. For example, the control section 100 is formed of a micro-processor or process controller. The control section 100 is connected to the boat elevator (not shown), heater 8, motor of the rotation mechanism 13, heater 16, MFCs disposed on the process gas feed line 17 and purge gas feed line 18, main valve 21, pump 22, trap 23, sub valve 25, needle valve 26, infrared sensor 27, and heater for the exhaust piping line. The control section 100 controls the necessary members (including the infrared sensor 27) to measure temperatures, pressures, and other conditions at respective portions of the heat-processing apparatus 1. The information processor 102 of the control section 100 performs various judgments on the basis of the measurement data. As a consequence, the control section 100 outputs control signals to the respective portions of the heat-processing apparatus 1 to control them in accordance with the recipes (time sequences) shown in FIGS. 3 and 4.

Figure 3:
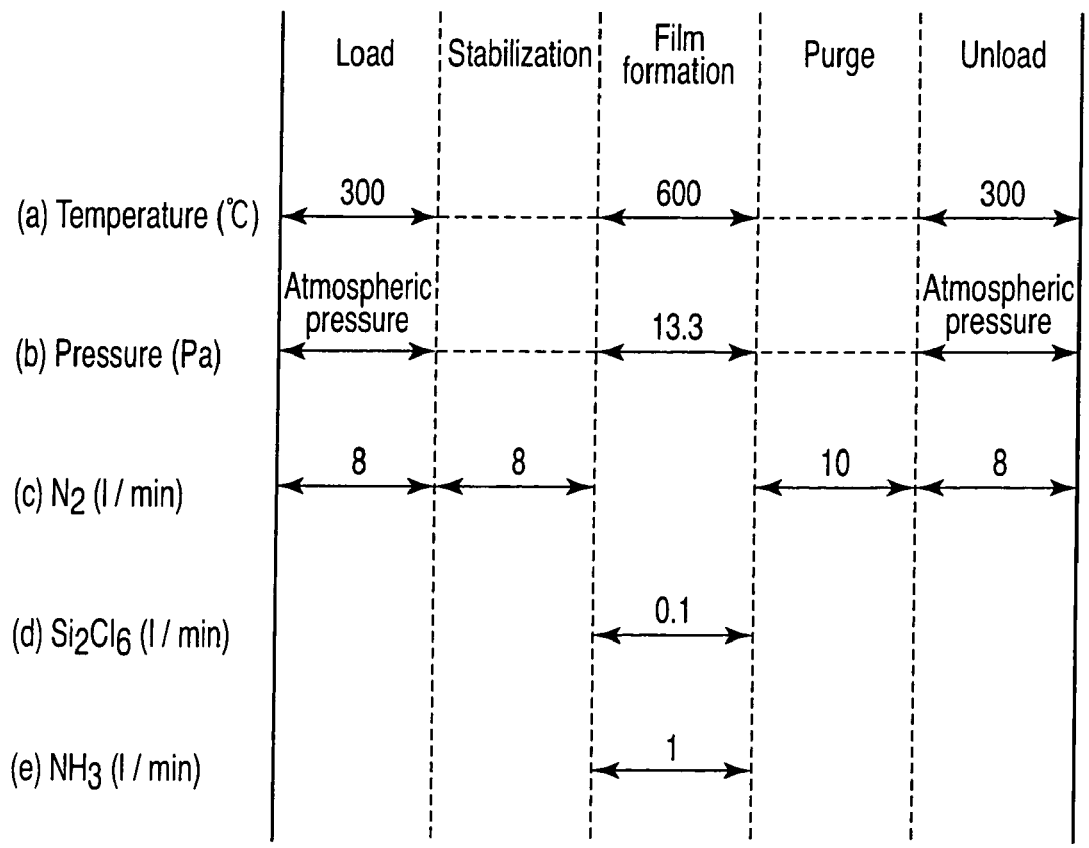
FIG. 3 is a view showing the recipe of a film formation process according to an embodiment of the present invention.

Next, an explanation will be given of a method of using the heat-processing apparatus 1 described above, with reference to FIGS. 3 and 4. FIG. 3 is a view showing the recipe of a film formation process according to an embodiment of the present invention. FIG. 4 is a view showing the recipe of a cleaning process according to an embodiment of the present invention. In the film formation process, in order to from a silicon nitride film on a semiconductor wafer W, a film formation gas is supplied into the reaction tube 2 while the interior of the reaction tube 2 is set at a temperature and a pressure to decompose the film formation gas. In the cleaning process, in order to remove by-product films, which contain silicon nitride as the main component (meaning at 50% or more), deposited inside the reaction tube 2, a cleaning gas is supplied into the reaction tube 2, while the interior of the reaction tube 2 is set at a temperature and a pressure to enable the cleaning gas to react with the by-product films.

Specifically, in the film formation process, at first, the interior of the reaction tube 2 is heated by the heater 16 at a predetermined load temperature, such as 300° C., as shown in FIG. 3, (a). Further, nitrogen ($N_2$) is supplied through the purge gas feed line 18 into the reaction tube 2 at a predetermined flow rate, such as 8 liters/min, as shown in FIG. 3, (c). Then, a wafer boat 11 that holds semiconductor wafers W is placed on the lid 6, and the lid 6 is moved up by the boat elevator (not shown). As a consequence, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, such as 8 liters/min, as shown in FIG. 3, (c). Further, the interior of the reaction tube 2 is heated by the heater 16 to a predetermined film formation temperature (process temperature), such as 600° C., as shown in FIG. 3, (a). Furthermore, while the opening degree of the main valve 21 is controlled, gas inside the reaction tube 2 is exhausted to set the interior of the reaction tube 2 at a predetermined pressure, such as 13.3 Pa (0.1 Torr), as shown in FIG. 3, (b). The pressure reduction and heating operations are kept performed until the reaction tube 2 is stabilized at the predetermined pressure and temperature (stabilization step). During the film formation process, the sub valve 25 is preferably set closed to prevent exhaust gas from the reaction tube 2 from flowing into the bypass line 24.

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing silicon and a second film formation gas containing nitrogen are supplied through the process gas feed line 17 into the reaction tube 2. In this embodiment, the first film formation gas contains hexachloro disilane ($Si_2Cl_6$) supplied at a predetermined flow rate, such as 0.1 liters/min, as shown in FIG. 3, (d). The second film formation gas contains ammonia ($NH_3$) supplied at a predetermined flow rate, such as 1 liter/min, as shown in FIG. 3, (e).

The hexachloro disilane and ammonia supplied into the reaction tube 2 cause a thermal decomposition reaction, using heat inside the reaction tube 2. The decomposition components produce silicon nitride ($Si_3N_4$), from which a silicon nitride film is formed on the surface of the semiconductor wafers W (film formation step).

When the silicon nitride film formed on the surface of the semiconductor wafers W reaches a predetermined thickness, the supply of hexachloro disilane and ammonia through the process gas feed line 17 is stopped. Then, the interior of the reaction tube 2 is exhausted, and nitrogen is supplied through the purge gas feed line 18 at a predetermined flow rate, such as 10 liters/min, as shown in FIG. 3, (c). By doing so, the gas inside the reaction tube 2 is exhausted to the exhaust line 5 (purge step). It is preferable to perform cycle purge that repeats the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 300° C., as shown in FIG. 3, (a). Further, nitrogen is supplied through the purge gas feed line 18 into the reaction tube 2 at a predetermined flow rate, such as 8 liters/min, as shown in FIG. 3, (c). The pressure inside the process tube 2 is thereby returned to atmospheric pressure, as shown in FIG. 3, (b). Then, the lid 6 is moved down by the boat elevator (not shown), and the wafer boat 11 is thereby unloaded (unload step).

When repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a cleaning process is performed for the heat-processing apparatus 1.

In the cleaning process, a cleaning gas ($F_2$, HF, and $N_2$) is supplied into the reaction tube 2, to remove by-product films containing silicon nitride ($Si_3N_4$) as the main component. At this time, the concentration of silicon tetrafluoride ($SiF_4$) in exhaust gas from the reaction tube 2 is measured by the infrared sensor 27 to determine the end point of cleaning on the basis of the $SiF_4$ concentration.

Specifically, in the cleaning process, at first, the interior of the reaction tube 2 is maintained by the heater 16 at a predetermined load temperature, such as 300° C., as shown in FIG. 4, (a). Further, nitrogen is supplied through the purge gas feed line 18 into the reaction tube 2 at a predetermined flow rate, such as 8 liters/min, as shown in FIG. 4, (c). Then, an empty wafer boat 11 that holds no semiconductor wafers W is placed on the lid 6, and the lid 6 is moved up by the boat elevator (not shown). As a consequence, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, such as 8 liters/min, as shown in FIG. 4, (c). Further, the interior of the reaction tube 2 is heated by the heater 16 at a predetermined cleaning temperature, such as 300° C., as shown in FIG. 4, (a). Furthermore, gas inside the reaction tube 2 is exhausted to set the interior of the reaction tube 2 at a predetermined pressure, such as 53,200 Pa (400 Torr), as shown in FIG. 4, (b). The pressure reduction and heating operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, a cleaning gas is supplied through the process gas feed line 17 into the reaction tube 2. In this embodiment, the cleaning gas contains hydrogen fluoride (HF) supplied at a predetermined flow rate, such as 2 liters/min, as shown in FIG. 4, (d), fluorine ($F_2$) supplied at a predetermined flow rate, such as 2 liters/min, as shown in FIG. 4(e), and nitrogen or dilution gas supplied at a predetermined flow rate, such as 8 liters/min, as shown in FIG. 4, (c).

The cleaning gas is heated in the reaction tube 2, and fluorine in the cleaning gas is activated, thereby forming a state in which a number of reactive free atoms are present. The activated fluorine comes into contact with by-product films (containing silicon nitride as the main component) deposited on the inner surface of the reaction tube 2 and so forth. As a consequence, the cleaning gas reacts with the by-product films, as shown in the following formula (1).

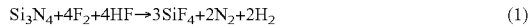
$$Si_3N_4 + 4F_2 + 4HF \rightarrow 3SiF_4 + 2N_2 + 2H_2 \qquad (1)$$

The reaction products ($SiF_4$, $N_2$, $H_2$, etc.) thereby produced are exhausted from the reaction tube 2, through the exhaust port 4, exhaust line 5, and exhaust piping line 20, out of the apparatus. As a consequence, by-product films (containing silicon nitride as the main component) deposited in the reaction tube are removed (cleaning step). In this cleaning step, the temperature inside the reaction tube 2 is preferably maintained at a temperature within a range of from 200° C. to 500° C. Further, the pressure inside the reaction tube 2 is preferably maintained at a pressure within a range of from 13.3 Pa (0.1 Torr) to 53,320 Pa (400 Torr).

During a predetermined period of the cleaning step, such as the entire step or a latter part of the step, the concentration of silicon tetrafluoride ($SiF_4$) contained in exhaust gas is monitored by the infrared sensor 27. The measurement value obtained by the infrared sensor 27 is compared with a predetermined reference value (preset value), and the end point of cleaning is thereby determined in the information processor 102 of the control section 100. Based on the determined end point, the control section 100 further executes the following steps to finish the cleaning. The determination sequence of the end point will be explained later in detail.

When the by-product films deposited inside the reaction tube 2 are removed, the supply of the cleaning gas through the process gas feed line 17 is stopped (preferably, immediately after the end point). Then, the interior of the reaction tube 2 is exhausted, and nitrogen is supplied through the purge gas feed line 18 into the reaction tube 2 at a predetermined flow rate, such as 8 liters/min, as shown in FIG. 4, (c). By doing so, the gas inside the reaction tube 2 is exhausted to the exhaust line 5 (purge step).

Then, the interior of the reaction tube 2 is set by the heater 16 at a predetermined temperature, such as 300° C., as shown in FIG. 4, (a). Further, nitrogen is supplied through the purge gas supply line 18 into the reaction tube 2 at a predetermined flow rate, such as 8 liters/min, as shown in FIG. 4, (c). The pressure inside the process tube 2 is thereby returned to atmospheric pressure, as shown in FIG. 4, (b). Then, the lid 6 is moved down by the boat elevator (not shown), and the wafer boat 11 is thereby unloaded (unload step).

As the process described above is being performed, by-product films deposited on the inner surface of the reaction tube 2, the surface of the wafer boat 11, and so forth are removed. Thereafter, a wafer boat 11 with a new lot of semiconductor wafers W mounted thereon is placed on the lid 6, and the film formation process is started again in the manner described above.

Next, a detailed explanation as to how to determine the end point will be given below.

During a predetermined period of the cleaning step, such as the entire step or a latter part of the step, the concentration of a predetermined component contained in exhaust gas from the reaction tube 2, such as silicon tetrafluoride ($SiF_4$) as in this embodiment, is monitored (measured) by the infrared sensor 27. In this embodiment, when the exhaust gas from the reaction tube 2 comes to show no content of silicon tetrafluoride, it is assumed that by-product films containing silicon nitride as the main component inside the reaction tube 2 have been completely removed, and thus it is determined that this is the end point of the cleaning step.

Accordingly, during the cleaning step, in order to perform the monitoring, the sub valve 25 is opened to introduce part of the exhaust gas from the reaction tube 2 into the bypass line 24 (infrared sensor 27) branching from the exhaust piping line 20. This part of the exhaust gas from the reaction tube 2 is supplied into the cell 32 of the infrared sensor 27 as a measurement sample, so that the concentration of silicon tetrafluoride is measured by the infrared sensor 27.

Within the infrared sensor 27, the infrared light beam IR from the light emitter 33 is radiated into the cell 32 through the window 31a, and passes through the exhaust gas, window 31b, and optical filter 35, onto the light receiver 36. At this time, depending on the concentration of silicon tetrafluoride contained in the exhaust gas from the reaction tube 2, a predetermined wavelength band of the infrared light beam IR is partly absorbed. The optical filter 35 allows only this predetermined wavelength band of the infrared light beam IR to pass therethrough toward the light receiver 36. The light receiver 36 formed of a pyroelectric infrared detector calculates the concentration of silicon tetrafluoride, on the basis of a decreasing ratio of the amplitude of a signal obtained when silicon tetrafluoride is present, relative to the amplitude of a signal obtained when silicon tetrafluoride is not present.

As described above, according to this infrared sensor 27, the infrared light beam IR from the light emitter 33 is caused to pass through the exhaust gas and optical filter 35, and is then detected by the light receiver 36, so as to measure the concentration of silicon tetrafluoride. The information processor 102 of the control section 100 is used to compare the measurement value obtained by the infrared sensor 27 with a predetermined reference value (preset value), and thereby determine the end point of cleaning. The control section 100 performs the necessary steps to finish the cleaning, in accordance with the end point thus determined.

According to this embodiment, since the end point of cleaning is determined, using the infrared sensor 27, it is possible to perform cleaning inside the reaction tube 2 for a suitable cleaning time period. As a consequence, members inside the reaction tube 2, such as the inner wall, are less damaged, thereby suppressing particle generation. In addition, the cleaning gas is prevented from being wastefully consumed.

Further, only a predetermined wavelength band of the infrared light beam IR passes therethrough the optical filter 35 to the light receiver 36, wherein the predetermined wavelength band corresponds to a band absorbed by silicon tetrafluoride. Accordingly, the light receiver 36 is required only to treat the predetermined wavelength band, and thus can have a simple structure. In the cleaning step, the windows 31a and 31b of the infrared sensor 27 are preferably heated to 150° C. or more by the heater 34. In this case, the cell 32 and windows 31a and 31b can be free from deposition of by-product powder exhausted from the reaction tube 2. As a consequence, the windows 31a and 31b are prevented from lowing the transmittance, thereby maintaining the performance of the infrared sensor 27.

PRESENT EXAMPLE 1

In a present example 1, using the apparatus shown in FIG. 1, a silicon nitride film of 5 μm was deposited on the inner wall of the reaction tube 2, and a cleaning process was performed thereon, under conditions described with reference to the recipe shown in FIG. 4. At this time, the concentration of silicon tetrafluoride contained in cleaning exhaust gas was monitored by the infrared sensor 27.

FIG. 5 is a graph showing change with time in the concentration of silicon tetrafluoride contained in cleaning exhaust gas, obtained by this experiment. As shown in FIG. 5, the concentration of silicon tetrafluoride increased essentially simultaneously with the start of cleaning (2 minutes in the time scale of FIG. 5), and, at about 45 minutes later (47 minutes in the time scale of FIG. 5), it returned to the same level as that of before cleaning. In this case, 45 minutes after the start of cleaning can be regarded as the end point of cleaning.

In the present example 1, the interior of the reaction tube 2 was observed after the cleaning step, and found that no deposition of the silicon nitride film was left. Accordingly, it was confirmed that the silicon nitride film deposited inside the reaction tube 2 was completely removed by the cleaning for 45 minutes.

COMPARATIVE EXAMPLE 1

In a comparative example 1, using the apparatus shown in FIG. 1, a cleaning process was performed under the same conditions as the present example 1, and, at this time, the temperature in the reaction tube 2 was monitored. This operation corresponds to a conventional method of managing cleaning time period by monitoring temperature.

Figure 6:
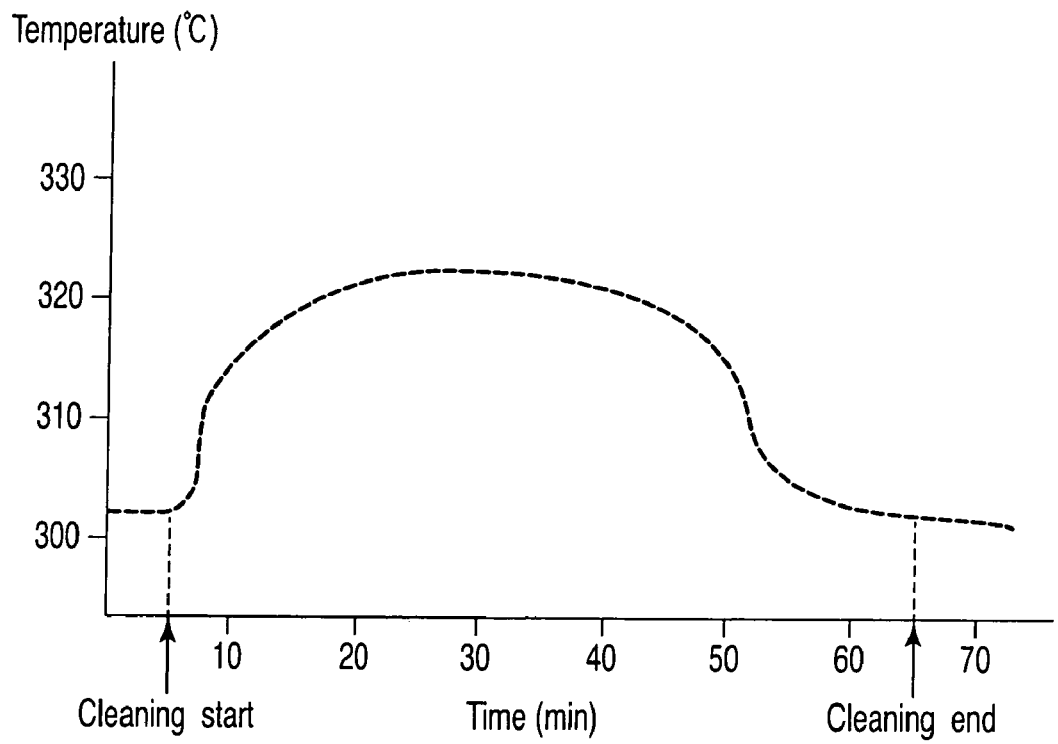
FIG. 6 is a graph showing change with time in the temperature inside the reaction tube being cleaned.

FIG. 6 is a graph showing change with time in the temperature inside the reaction tube being cleaned, obtained by this experiment. As shown in FIG. 6 the temperature inside the reaction tube increased with the start of cleaning (5 minutes in the time scale of FIG. 6), and, at about 60 minutes later (65 minutes in the time scale of FIG. 6), it returned to the same level as that of before cleaning. In this case, 60 minutes after the start of cleaning can be regarded as the end point of cleaning.

Accordingly, the end point obtained by this conventional method of utilizing temperature monitoring for management was 15 minutes longer than the present example 1. This is thought to have been caused by an influence of reaction heat generated by a reaction between the cleaning gas and quartz.

Additional Experiment

Further, the thickness of a silicon nitride film deposited on the inner wall of the reaction tube 2 was set at different values of 1.5, 2, 3, and 4 μm, and the same experiments as the present example 1 and comparative example 1 were conducted for each thickness. As a result, it was confirmed that they showed the same aptitude as the silicon nitride film having a thickness of 5 μm.

Modification 1

In a modification 1, using the apparatus shown in FIG. 1, a silicon dioxide film of 5 μm was deposited on the inner wall of the reaction tube 2, and a cleaning process was performed thereon by a cleaning gas containing hydrogen fluoride (HF) and ammonia ($NH_3$). At this time, the concentration of ethanol ($C_2H_5OH$) contained in cleaning exhaust gas was monitored by the infrared sensor 27.

Figure 7:
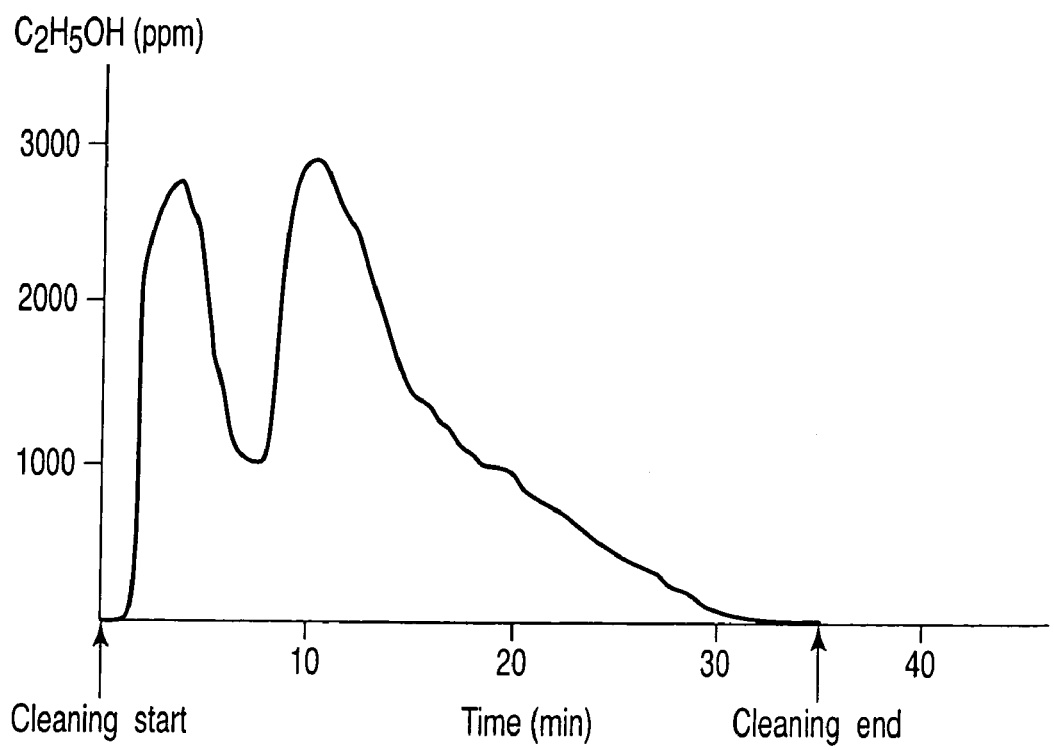
FIG. 7 is a graph showing change with time in the concentration of ethanol contained in cleaning exhaust gas.

FIG. 7 is a graph showing change with time in the concentration of ethanol contained in cleaning exhaust gas, obtained by this experiment. As shown in FIG. 7, the concentration of ethanol increased with the start of cleaning, and, at about 35 minutes later, it returned to the same level as that of before cleaning. In this case, 35 minutes after the start of cleaning can be regarded as the end point of cleaning. As shown in FIG. 7, two peaks appeared in the concentration of ethanol. This is thought to have been caused by the fact that by-products were deposited at a plurality of positions, e.g., two positions, inside the reaction tube.

In the modification 1, the interior of the reaction tube 2 was observed after the cleaning step, and found that no deposition of the silicon dioxide film was left. Accordingly, it was confirmed that the silicon dioxide film deposited inside the reaction tube 2 was completely removed by the cleaning for 35 minutes.

The present invention is not limited to the embodiment described above, and it may be modified or applied in various manners. Other possible embodiments according to the present invention will be described below.

In the embodiment described above, a silicon tetrafluoride is selected as a predetermined component contained in the exhaust gas from the reaction tube 2. However, the predetermined component differs depending on the type of by-product film deposited in a reaction tube (i.e., the type of thin film formed on a target substrate, such as a semiconductor wafer W), and the type of cleaning gas.

Other than silicon nitride, the thin film formed on a target substrate may consist of silicon dioxide ($SiO_2$), titanium nitride (TiN), tungsten (W), $WSiO_2$, poly-crystalline silicon, aluminum oxide, hafnium oxide ($HfO_2$), hafnium silicate ($HfSiO_2$), or hafnium nitride silicate. In this case, by-product films deposited inside a reaction tube may contain silicon nitride, silicon dioxide, titanium nitride, tungsten, poly-crystalline silicon, aluminum oxide, hafnium oxide, hafnium silicate, hafnium nitride silicate, or a derivative thereof. Any gas can be used as a cleaning gas, as long as it can remove by-product films deposited inside a reaction tube; such as, fluorine, hydrogen fluoride, chlorine trifluoride, ammonia, chlorine, or a mixture thereof.

For example, where by-product films deposited inside a reaction tube are silicon dioxide ($SiO_2$), the cleaning gas may be a gas containing hydrogen fluoride, a gas containing fluorine and hydrogen fluoride, or a gas containing hydrogen fluoride and ammonia. In this case, silicon tetrafluoride is preferably selected as a measurement object gas.

Where the cleaning gas is chlorine trifluoride ($ClF_3$), it is preferable to select the following gas as a measurement object gas, depending on the type of film formed on a target substrate. Specifically, where a silicon nitride film (SiN film) or silicon oxide film (SiO film) is formed on a target substrate, silicon tetrafluoride, silicon tetrachloride, or nitrogen trifluoride ($NF_3$) is preferably selected as a measurement object gas. Where a titanium nitride (TiN) film is formed on a target substrate, titanium tetrachloride ($TiCl_4$), titanium tetrafluoride ($TiF_4$), or nitrogen trifluoride ($NF_3$) is preferably selected as a measurement object gas. Where a tungsten film (W film) is formed on a target substrate, tungsten tetrafluoride ($WF_4$) is preferably selected as a measurement object gas. Where a $WSiO_2$ film is formed on a target substrate, silicon tetrafluoride or tungsten hexafluoride ($WF_6$) is preferably selected as a measurement object gas.

Where TEOS ($Si(C_2H_5O)_4$) is used to form a silicon dioxide film on a semiconductor wafer W, by-product films containing silicon dioxide, or containing carbon, hydrogen, and oxygen, are deposited in the reaction tube. In this case, for example, a gas containing hydrogen fluoride (HF) and ammonia ($NH_3$) is used as a cleaning gas, and ethanol ($C_2H_5OH$) is used as a measurement object gas. As a consequence, the end point of cleaning can be determined by the infrared sensor 27.

There is a case where by-product films deposited inside a reaction tube contain aluminum oxide, hafnium oxide, hafnium silicate, or hafnium nitride silicate. In this case, for example, aluminum tetrafluoride (AlF$_4$), hafnium tetrachloride (HfCl$_4$), or hafnium tetrafluoride (HfF$_4$) may be used as a measurement object gas.

In the embodiment described above, the cleaning gas contains nitrogen gas as a dilution gas. However, the cleaning gas may contain no dilution gas. The dilution gas is preferably an inactive gas, such as, helium gas (He), neon gas (Ne), or argon gas (Ar), as well as nitrogen gas.

In the embodiment described above, the concentration of silicon tetrafluoride contained in the exhaust gas from the reaction tube 2 is continuously measured in the cleaning step. However, the concentration may be intermittently measured at, e.g., every several minutes. In this case, it is preferable to set the measurement intervals to be shorter with the progress of cleaning.

In the embodiment described above, the infrared sensor 27 is arranged to selectively detect a predetermined wavelength band, which corresponds to that absorbed by a predetermined component selected as a measurement object (i.e., the infrared sensor 27 is arranged to have wavelength selectivity). Specifically, the light emitter 3 emits the infrared light beam IR having a wide wavelength band, and the optical filter 35 only allows the predetermined wavelength band to pass therethrough. As an alternative to this arrangement using the optical filter 35, a light source only emitting a predetermined wavelength band, such as a semiconductor infrared laser, may be employed, so that the infrared sensor 27 has wavelength selectivity. Alternatively, the infrared sensor 27 may be arranged to have no wavelength selectivity, and, even in this case, cleaning can be performed inside the reaction tube 2 for a suitable cleaning time period.

In the embodiment described above, the bypass line 24 is connected to the exhaust piping line 20, and provided with the infrared sensor 27 thereon. However, for example, the infrared sensor 27 may be disposed not on the bypass line 24 but on the exhaust piping line 20, so that the concentration of a predetermined component contained in the exhaust gas from the reaction tube 2 can be measured. Further, the measuring section for measuring the concentration of the predetermined component may utilize various sensors other than the infrared sensor.

In the embodiment described above, the reaction tube 2 and lid 6 are made of quartz. Alternatively, these members may be made of another material, such as silicon carbide (SiC).

In the embodiment described above, the process gas feed lines 17 are disposed in accordance with the type of process steps. Alternatively, for example, a plurality of process gas feed lines 17 may be disposed in accordance with the type of gases (e.g., five lines for fluorine, hydrogen fluoride, hexachloro disilane, ammonia, and nitrogen). Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiment described above, the heat-processing apparatus employed is a heat-processing apparatus of the batch type having a single-tube structure. However, for example, the present invention may be applied to a vertical heat-processing apparatus of the batch type having a reaction tube 2 of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

What is claimed is:

1. A method for using a film formation apparatus for a semiconductor process, the method comprising:
    performing cleaning inside a reaction chamber of the film formation apparatus to remove a by-product film deposited inside the reaction chamber, while supplying a cleaning gas into the reaction chamber, and setting the interior of the reaction chamber at a temperature and a pressure to cause the cleaning gas to react with the by-product film, the by-product film having been deposited inside the reaction chamber by performing film formation of forming a film on a target substrate by use of TEOS (Si(C$_2$H$_5$O)$_4$) inside the reaction chamber;
    monitoring a concentration of ethanol generated due to etching of the by-product film by the cleaning gas and contained in exhaust gas from the reaction chamber in a predetermined period of the cleaning;
    comparing a measurement value of the concentration of the ethanol with a preset value, and thereby determining an end point of the cleaning; and
    finishing the cleaning based on the end point.

2. The method according to claim 1, wherein the film formation apparatus comprises a concentration measuring section and an information processor connected to a control section configured to control an operation of the apparatus, the concentration of the ethanol is monitored by the concentration measuring section, and the end point is determined by the information processor.

3. The method according to claim 1, wherein the film formation apparatus comprises an infrared sensor configured to measure the concentration of the ethanol based on a wavelength absorbed by the ethanol when infrared rays are radiated onto the exhaust gas.

4. The method according to claim 3, wherein the infrared sensor is configured to selectively detect a wavelength band absorbed by the ethanol.

5. The method according to claim 3, wherein the infrared sensor comprises a light emitter and a light receiver respectively disposed outside a pair of windows formed in a wall defining a passage of the exhaust gas.

6. The method according to claim 5, wherein the infrared sensor comprises a heater configured to heat the pair of windows to 150° C. or more.

7. The method according to claim 1, wherein monitoring the concentration of the ethanol comprises using a bypassed part of the exhaust gas as a measurement sample.

8. The method according to claim 1, wherein the cleaning gas comprises at least one gas selected from the group consisting of fluorine, hydrogen fluoride, chlorine trifluoride, ammonia, and chlorine.

9. The method according to claim 1, wherein the by-product film comprises silicon dioxide.

10. A method for using a film formation apparatus for a semiconductor process, the apparatus comprising
    a reaction chamber configured to accommodate a target substrate,
    a heater configured to heat an interior of the reaction chamber,
    an exhaust system configured to exhaust the interior of the reaction chamber,
    a film formation gas supply circuit configured to supply a film formation gas into the reaction chamber to perform film formation of forming a film on the target substrate,
    a cleaning gas supply circuit configured to supply a cleaning gas into the reaction chamber to perform cleaning inside the reaction chamber, a concentration measuring section including an infrared sensor disposed on the exhaust system to monitor concentration of a predetermined component contained in exhaust gas from the reaction chamber, an information processor configured to compare a measurement value obtained by the concentration measuring section with a preset value and to thereby determine an end point of the cleaning, and a control section configured to control an operation of the apparatus, and the method being performed under control of the control section and comprising:

performing film formation of forming a film on a target substrate by use of TEOS ($Si(C_2H_5O)_4$) inside the reaction chamber, wherein a by-product film is deposited inside the reaction chamber during the film formation;

performing cleaning inside the reaction chamber to remove the by-product film deposited inside the reaction chamber, while supplying the cleaning gas into the reaction chamber, and setting the interior of the reaction chamber at a temperature and a pressure to cause the cleaning gas to react with the by-product film;

monitoring concentration of ethanol generated due to etching of the by-product film by the cleaning gas and contained in exhaust gas from the reaction chamber, by the infrared sensor in a predetermined period of the cleaning, the infrared sensor being configured to measure the concentration of the ethanol based on a wavelength absorbed by the ethanol when infrared rays are radiated onto the exhaust gas;

comparing a measurement value of the concentration of the ethanol with a preset value by the information processor, and thereby determining an end point of the cleaning; and finishing the cleaning based on the end point.

11. The method according to claim 10, wherein the by-product film comprises silicon dioxide, and the cleaning gas comprises at least one gas selected form the group consisting of fluorine, hydrogen fluoride, chlorine trifluoride, ammonia, and chlorine.

12. The method according to claim 10, wherein the reaction chamber is configured to accommodate a plurality of target substrates at intervals in a vertical direction.

* * * * *